(12) United States Patent
Schempp et al.

(10) Patent No.: US 8,128,433 B2
(45) Date of Patent: Mar. 6, 2012

(54) MODULAR JACK HAVING A CROSS TALK COMPENSATION CIRCUIT AND ROBUST RECEPTACLE TERMINALS

(75) Inventors: Otto Schempp, Bad Rappenau (DE); Karl Heinz Noller, Flein (DE)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 12/514,985

(22) PCT Filed: Nov. 14, 2006

(86) PCT No.: PCT/US2006/044063
§ 371 (c)(1),
(2), (4) Date: Aug. 13, 2010

(87) PCT Pub. No.: WO2008/060272
PCT Pub. Date: May 22, 2008

(65) Prior Publication Data
US 2011/0097935 A1    Apr. 28, 2011

(51) Int. Cl.
*H01R 13/66* (2006.01)
(52) U.S. Cl. .................................. 439/620.22
(58) Field of Classification Search .............. 439/620.22, 439/676
See application file for complete search history.

(56) References Cited

U.S. PATENT DOCUMENTS

| | | | |
|---|---|---|---|
| 6,305,950 B1 * | 10/2001 | Doorhy | 439/76.1 |
| 6,350,158 B1 * | 2/2002 | Arnett et al. | 439/676 |
| 6,428,362 B1 * | 8/2002 | Phommachanh | 439/676 |
| 6,547,604 B2 * | 4/2003 | Arnett et al. | 439/676 |
| 7,175,476 B2 * | 2/2007 | Kim et al. | 439/620.11 |
| RE39,546 E * | 4/2007 | Phommachanh | 439/676 |
| 7,204,722 B2 * | 4/2007 | Hashim et al. | 439/676 |
| 7,294,025 B1 * | 11/2007 | Chen | 439/676 |
| RE41,052 E * | 12/2009 | Phommachanh | 439/676 |

* cited by examiner

*Primary Examiner* — Tulsidas C Patel
*Assistant Examiner* — Vladimir Imas
(74) *Attorney, Agent, or Firm* — Stephen L. Sheldon

(57) ABSTRACT

The present invention is direct to a modular jack (10) having improved cross talk compensation performances. A printed circuit board (30) is inserted into the housing (20) of the modular jack (10). Robust receptacle terminals (11 to 18) and a multi-stage time delay and cross talk compensation circuitry are disposed on the circuit board (30) to reduce cross talk induced between receptacle terminals. Each robust receptacle terminal (11-18) comprises first and second legs (11a, lib; lid) located over one another with one end of each leg joined to the other leg by a bent portion (lie). The first leg (11a, lib) ends in a free end and the second leg (lid) extends from the base end (11f) to the bent portion (lie) to form an acute angle with the circuit board (30). The bent portion (lie) of each receptacle terminal is cantilevered to engage the circuit board at least when one or more of the receptacle terminals (11-18) is contacted by the terminal of a modular plug.

20 Claims, 7 Drawing Sheets

MODULAR JACK HAVING A CROSS TALK COMPENSATION CIRCUIT AND ROBUST RECEPTACLE TERMINALS

This application claims priority to International Application Serial No. PCT/US2006/044063, filed on Nov. 14, 2006, which is incorporated herein by reference in its entirety.

FIELD OF THE INVENTION

This invention generally relates to electrical connectors, such as modular jacks, and particularly to a cross talk compensation assembly for mounting within a modular jack, wherein a circuit board is provided which supports a plurality of receptacle terminals which are electrically connected to conductive traces.

BACKGROUND OF THE INVENTION

In the telecommunications industry connectors are commonly used which are designed according to certain mechanical and electrical standards. A well known electrical connector is the RJ 45 connector, which comprises a RJ 45 modular jack and a RJ 45 modular plug. A RJ 45 jack comprises generally eight contact elements or receptacle terminals which are located side by side within in a dielectric housing. In particular, RJ 45 jacks are used for high frequency transmission so that cross talk occurs between adjacent receptacle terminals. It has become to a major challenge to design connectors adapted to transmit high frequency data which lead to a reduced interference between adjacent receptacle terminals.

U.S. Pat. No. 6,840,779 B2 discloses a printed circuit board which is mounted within a modular jack. The printed circuit board comprises only a single compensation stage which includes capacitors disposed between the front side of the printed circuit board and the contact elements.

In order to reduce interference caused within a modular jack U.S. Pat. No. 6,840,779 B2 discloses a female connector mounted onto a base printed circuit board. A printed circuit board is mounted within the female connector. The compensation printed circuit board carries decoupling capacitors forming a single cross talk compensation stage which are connected to respective contact elements mounted on the printed circuit board. Each contact element on the compensation printed circuit board comprises a first leg ending in a free end. The first leg is connected to a second leg by a curved portion. The second leg is soldered to the compensation printed circuit board. which, in turn is electrically contacted to the base printed circuit board. The contact elements have a short electrical length in order to reduce the rise of cross talk within the modular jack. However, the prior art design does not have enough elastic deflection performance to compensate huge dimensional tolerances of a modular plug since the second leg of the contact elements is soldered at least over a portion of its length onto the compensation printed circuit board. Therefore, a frequent coupling and decoupling of the modular jack with the respective plug leads to a permanent deformation of the contact elements.

The single compensation stage of the known female connector is not able to sufficiently reduce cross talk so that an additional compensation circuit is arranged outside the female connector, i.e. on a base printed circuit board which the modular jack is mounted on.

Electrical signal transmission systems are disclosed in U.S. Pat. No. 5,310,363 which use specific conductor crossing techniques to reduce cross talk induced within a modular jack. A first system is described which comprises a printed circuit board which a modular jack is mounted on. Conductors running parallel and adjacent on the circuit board are crossed respectively to reduce cross talk between the respective conductors. According to a further known connector apparatus, a conductor array is mounted within a modular jack. Predetermined conductors of the conductor array are crossed to reduce cross talk introduced between them.

U.S. Pat. No. 5,997,358 discloses an electrical connector system which comprises a jack mounted on a printed wiring board. The printed wiring board includes two pairs of metallic conductors which comprise first and second compensating stages by crossing the metallic conductors of the first pair twice to cancel offending cross talk. U.S. Pat. No. 5,997,358 further discloses a communication jack assembly which comprises a multi-layer printing wiring board. In particular, the wiring board comprises eight layers of wiring paths. Each of the layers comprises metallic paths to provide three stages of compensating cross talk between respective wire pairs. The jack assembly further comprises a jack frame that is dimensioned to receive a modular plug in its front end and a rear opening that is dimensioned to receive the forward edge of the wiring board including jack wires.

In order to introduce multiple stages of compensating cross talk U.S. Pat. No. 5,997,358 further discloses to combine cross over technology with discrete component technology.

Moreover an electrical connector is disclosed which comprises time-delayed cross talk compensation. This is achieved by a conductor array which includes conductor leads which cross over each other in two locations in order to cancel cross talk.

It is an object of the present invention to provide a robust receptacle terminal for use within a modular jack which meet the mechanical requirements of an RJ 45 jack terminal.

It is a further object of the present invention to provide a compact modular jack with improved cross talk compensation performance in connection with robust receptacle terminals which normally increase cross talk between them.

SUMMARY OF THE INVENTION

It is a main concept of the present invention to provide a cross talk compensation assembly for use within a modular jack.

The cross talk compensation assembly comprises a two-layer circuit board having a plurality of conductive traces which form at least partially a multi-stage interference compensation circuit. This is achieved without crossing the conductive traces neither on the top layer nor on the bottom layer of the circuit board. Furthermore, a plurality of robust receptacle terminals, e.g. contact springs, are mounted on the circuit board. It is to be noted, that robust receptacle terminals require a sufficiently long working length which significantly increases the level of cross talk in the modular jack. Therefore, a multi-stage compensation circuitry has been designed on the top layer and the bottom layer of the circuit board which works only internal of the modular jack for obtaining sufficient cross talk compensation performance as required by the IEC.

According to one aspect of the present invention there is provided a cross talk compensation assembly for mounting within a modular jack. The cross talk compensation assembly comprises a circuit board which has a rear end, a front end and a plurality of conductive traces thereon, which are at least partially adapted to compensate cross talk. In a preferred embodiment, the conductive traces extend over the entire top and bottom surface of the circuit board.

Furthermore, a plurality of receptacle terminals, e.g. electrical spring contacts are supported on the circuit board. Each receptacle terminal includes a base end fixed to the circuit board. Furthermore, first and second legs of the receptacle terminal are located over one another with one end of each leg joined to the other leg by a bent portion. The first leg ends in a free end and the second end extends from the base end towards the bent portion such that it forms an acute angle with the circuit board. Furthermore, each receptacle terminal has at least one electrical contact area designed to electrically contact a respective one of the conductive traces on the circuit board. The bent portion of each receptacle terminal is cantilevered to engage the circuit board at least when one or more of the receptacle terminals is contacted by a terminal of a modular plug.

Such receptacle terminals are able to withstand a minimum contact normal deflection force of 1 Newton. Therefore, permanent deformation of the receptacle terminals can be avoided. With such a terminal design a sufficient elastic deflection performance is obtained to compensate the huge dimensional tolerances of a modular plug. Since the receptacle terminals are fixed in a predetermined distance from the working radius, this spring contacts can move without permanent deformation therefore increasing the flexibility.

Preferred embodiments are set forth in the depending claims.

In order to directly solder the receptacle terminal to the printed circuit board the base end of each receptacle terminal forms at least partially the electrical contact area. In particular, the base end is formed as a pin shaped tail which projects substantially perpendicular from the second leg. In particular, the base end and the second leg of each receptacle terminal form an angle which lies in a range of 35 degree to substantially 90 degree.

In order to compensate huge dimensional tolerances of an inserted modular plug the ratio between the length of the second leg and the length of the first leg of each receptacle terminal is larger than 0.8 and in particular about 1.

The second leg of each receptacle terminals spans a predetermined length on the circuit board to increase the area which compensation stages can be disposed on.

To obtain improved robust receptacle terminals the first leg of each receptacle terminal has a contact portion for engaging a terminal of a modular plug, wherein the width of the bent portion of each terminal is larger than the width of the contact portion of the first leg of the respective receptacle terminal.

In a preferred embodiment, the width of the bent portion tapers toward the free end of the first leg of each receptacle terminal.

In order to enhance the area on the printed circuit board which cross talk compensation stages or portions of cross talk compensation stages or time delay stages can be disposed on the bent portion of each receptacle terminals is electrically insulated from the circuit board by a dielectric material.

Each receptacle terminal is connected by a respective one of the conductive traces to an output terminal positioned at the rear side of the circuit board. Each output terminal is adapted to electrically contact a respective output conductor.

In order to sufficiently compensate cross talk between adjacent receptacle terminals only within a modular jack, e.g. an RJ45 jack, at least four conductive traces run on the top surface and/or on the bottom surface of the circuit board. Each conductive trace has a first contact region and a second contact region, wherein the first contact regions are arranged in a first row parallel and adjacent to the rear end. Each first contact region is adapted to electrically contact a separate output terminal. The second contact regions are arranged in a second row spaced apart from and parallel to the first row of the first contact regions. Each of the second contact regions is adapted to electrically contact a separate one of the receptacle terminals. The first row of first contact regions, the second row of second regions and a first length of each of the conductive traces define a first area on the top surface and a second area on the bottom surface, wherein a plurality of capacitive pads are disposed on the first area and the second area to form respective capacitors. The second row of second contact regions, a second length of each conductive trace and a third length of each conductive trace which extends adjacent to the front end of the circuit board define a third area on the top surface and a fourth area on the bottom surface, wherein the conductive traces are designed to form a plurality of cross talk compensation stages and time delay stages on the third area of the top surface and on the fourth area of the bottom surface.

In a preferred embodiment, the capacitive pads and the sections of the conductive traces forming the plurality of cross talk compensation stages and time delay stages are arranged symmetrically along the long central axis of the printed circuit board.

The above mentioned technical problem is also solved by a printed circuit board which is adapted to be mounted within a modular jack.

The printed circuit board comprises a rear end, a front end, a top surface and a bottom surface. At least four conductive traces run on the top surface and/or on the bottom surface of the circuit board. Each conductive trace includes a first contact region and a second contact region, wherein the first contact regions are arranged in a first row parallel and adjacent to the rear end. Each of the first contact regions is adapted to electrically contact a separate output terminal. The second contact regions are arranged in a second row spaced apart from and parallel to the first row of the first contact regions, wherein each of the second contact regions is adapted to electrically contact a separate receptacle terminal. The first row of first contact regions, the second row of second regions and a first length of each of the conductive traces define a first area on the top surface and a second area on the bottom surface, wherein a plurality of capacitive pads are disposed on the first area and the second area to form respective capacitors. The second row of second contact regions, a second length of each conductive trace and a third length of each conductive trace adjacent to the front end define a third area on the top surface and a fourth area on the bottom surface, wherein the conductive traces are designed to form a plurality of cross talk compensation stages and time delay stages on the third area of the top surface and on the second area of the bottom surface. The first and second contact regions may comprise through holes which can be at least partially plated.

In order to facilitate the process of designing and creating all the compensation stages on the circuit board as well as to obtain an optimized arrangement thereof the capacitive pads and the sections of the conductive traces forming the plurality of cross talk compensation stages and time delay stages are arranged substantially symmetrically along the long central axis of the printed circuit board.

Based on the wiring standard of RJ45 connectors a pair of adjacent second contact regions are connected by respective conductive traces to pair of adjacent first contact regions, thereby forming a first pair of signal paths. A further pair of second contact regions flanking the pair of adjacent second contact regions are connected via separate conductive traces to an other pair of adjacent first contact regions, thereby forming a second pair of signal paths.

In a preferred embodiment, at least one conductive trace of the first pair of signal paths and at least one conductive trace of the second pair of signal paths are disposed on the top surface and on the bottom surface of the circuit board. Each conductive trace of the first and second pairs of signal paths having first sections which are designed to form a first cross talk compensation stage on a first region of the circuit board to couple inductively and/or capacitively a first signal path of the first pair to a second signal path of the second pair of signal paths and a second signal path of the first pair to a first signal path of the second pair.

In order to obtain a multi-stage circuit board each conductive trace of the first and second pairs of signal paths having second sections which are designed to form a second cross talk compensation stage on a second region of the circuit board to couple inductively and/or capacitively the first signal path of the first pair to the first signal path of the second pair of signal paths and the second signal path of the first pair to a second signal path of the second pair.

To improve the compensation performance of the circuit board each conductive trace of the first and second pairs of signal paths having third sections which are designed to form a third cross talk compensation stage on a third region of the circuit board to couple inductively and/or capacitively a first signal path of the first pair to a second signal path of the second pair of signal paths and a second signal path of the first pair to a first signal path of the second pair.

In addition, each conductive trace of the first and second pairs of signal paths having fourth sections which are designed to form a first time delay stage on a fourth region of the circuit board to introduce a time delay on the signal paths of the first and second pairs.

Furthermore, each conductive trace of the first and second pairs of signal paths having fifth sections which are designed to form a second time delay stage on a fifth region of the circuit board to introduce a further time delay on the signal paths of the first and second pairs.

In a preferred embodiment, at least the second, third and fourth sections of each conductive trace of the first and second pair of signal paths are snake like formed with a longitudinal axis perpendicular to the longitudinal axis of the circuit board.

In order to minimize return loss on the printed circuit board the width of at least portions of the conductive traces forming the first, second and/or third cross talk compensation stage is wider than the width of the respective conductive traces forming the first and second time delay stage.

In a preferred embodiment, a fourth cross talk compensation stage is formed by the plurality of capacitive pads. Furthermore, the first through third cross talk compensation stages and both time delay stages are alternately disposed between the front end of the circuit board and the base ends of the receptacle terminals.

According to RJ45 wiring standard, eight receptacle terminals are mounted in a modular jack. Therefore, fifth and sixth conductive traces run on the top surface and seventh and eighth conductive traces run on the bottom surface of the circuit board. Each further conductive trace has a first contact region and a second contact region, wherein the first contact regions are arranged in the first row and the second contact regions are arranged in the second row. The fifth and sixth conductive traces are disposed on the first area of the top surface and extend between respective capacitive pads, whereas the seventh and eighth conductive traces are disposed on the second area of the bottom surface and extend between respective capacitive pads. With such a design capacitive and inductive coupling between these conductive traces is reduced.

It is a further aspect of the present invention is to provide a modular jack which has a complex internal cross talk compensation circuitry and robust receptacle terminals. Therefore, the modular jack comprises a dielectric housing and an assembly according to anyone of the claims 1 to 20 which is held in the housing.

In a preferred embodiment, the respective assembly is completely arranged in the housing.

In order to avoid bending of the printed circuit board if a plug is inserted into the modular jack the dielectric housing comprises elongated bars below the printed circuit board which support the printed circuit board.

It is a further aspect of the present invention to provide a robust receptacle terminal for use within a low cross talk modular jack. The receptacle terminal comprises a base end adapted to be mounted on a circuit board. The receptacle terminal further comprises first and second legs located over one another with one end of each leg joined to the other leg by a bent portion. The first leg ends in a free end and the second leg extends from the base end towards the bent portion such that it forms an acute angle with a circuit board. The receptacle terminal has at least one electrical contact area designed to electrically contact a respect of one of the conductive traces on a circuit board. The bent portion of the receptacle terminal is cantilevered to engage a circuit board at least when the receptacle terminal is contacted by a terminal of a modular plug.

Preferred embodiments are set forth in the dependent claims.

Other objects, features and advantages of the invention will be apparent from the following detail description taken in connection with accompanying drawings.

BRIEF DESCRIPTION OF THE DRAWINGS

The invention, together with its objects and the advantages thereof, may be best understood by reference to the following description taken in conjunction with the accompanying drawings, in which like reference numerals identify like elements in the Fig.s and in which.

DETAILED DESCRIPTION

Figure 1:
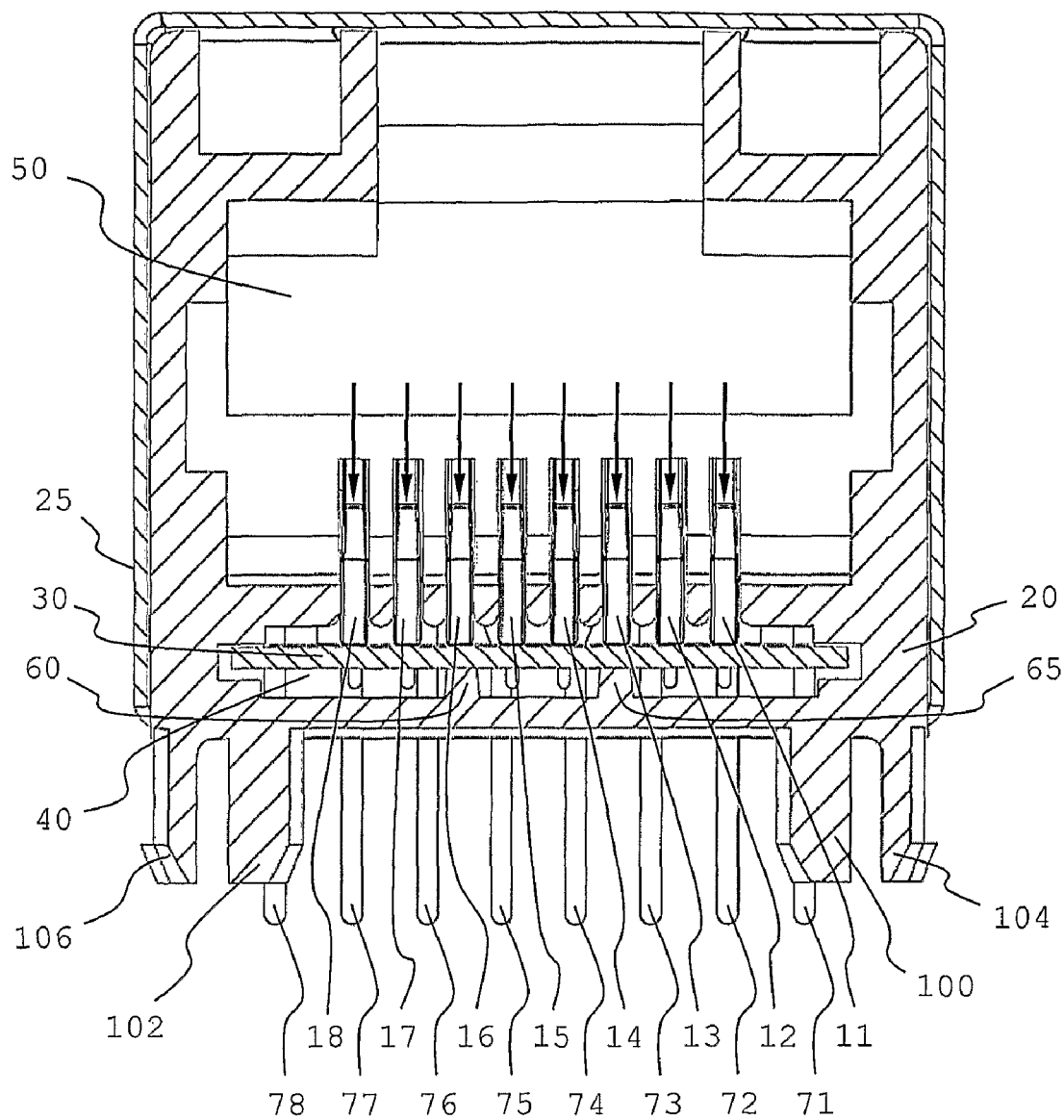
FIG. 1 shows a vertical section through the front mating portion of a modular jack and a printed circuit board mounted within the modular jack according to the invention.

FIG. 1 shows a vertical section through the mating surface of a modular jack 10 which comprises a dielectric housing 20 surrounded by a shielding member 25. The dielectric housing 20 defines a receptacle 50 for receiving a modular plug (not shown) as well as a separate opening 40 into which a printed circuit board 30 is inserted. In a preferred embodiment, the dielectric housing 20 is designed to allow sliding of the printed circuit board 30 from the rear end to the front or mating end of the dielectric housing 20. Furthermore, FIG. 1 shows eight receptacle terminals 11 to 18, also referred to as contact elements, which are arranged in a row and electrically connected to the printed circuit board 30. In this embodiment, the modular jack 10 is similar to a RJ45 female connector. According to RJ45 specification the receptacle terminals 11 and 12 are associated with a first pair 1-2 of signal paths of an RJ45 plug, the receptacle terminals 13 and 16 are associated with a second pair 3-6 of signal paths of an RJ45 plug, the receptacle terminals 14 and 15 are associated with a third pair 4-5 of signal paths of an RJ45 plug whereas the receptacle terminals 17 and 18 are associated with a fourth pair 7-8 of signal paths of an RJ45 plug. Due to the standardized wiring an increased amount of cross talk is induced between the pair of receptacle terminals 13 and 16 and the receptacle terminals 14 and 15. It is one aspect of the present to design the printed circuit board 30 such that cross talk generated within the modular jack 10 is compensated, even if robust receptacle terminals 11 to 18 are use as illustrated later which meets the requirements for high speed data connectors, in particular according to CAT6 specification. Robust receptacle terminals 11 to 18 are preferred in order to avoid permanent deformation if spring deflection forces are frequently applied to the terminals 11 to 18 as shown by the arrows.

Two supporting bars 60, 65 project from the bottom of the dielectric housing 20 into the opening 40 and extend, preferably, parallel to the longitudinal axis of the housing 50 from the front mating face to the rear face of the housing 50 to support the inserted circuit board 30. The supporting bars 60, 65 prevent the circuit board 30 from bending when spring deflection forces are applied to the receptacle terminals 11 to 18 caused by the contact terminals of a plug which is inserted into the receiving cavity 50 of the housing 20.

Furthermore, FIG. 1 shows output terminals in form of pins 71 to 78, which are disposed in a row at the rear side of the printed circuit board 30. The output terminals 71 to 78 are adapted to be connected to output conductors or conductive traces of a further printed circuit board.

The dielectric housing 20 may further includes, for example, retention hooks 104 and 106 and positioning posts 100 and 102 which allows the modular jack 10 to be mounted in a "click-on" technique onto a main PCB (not shown).

Figure 2:
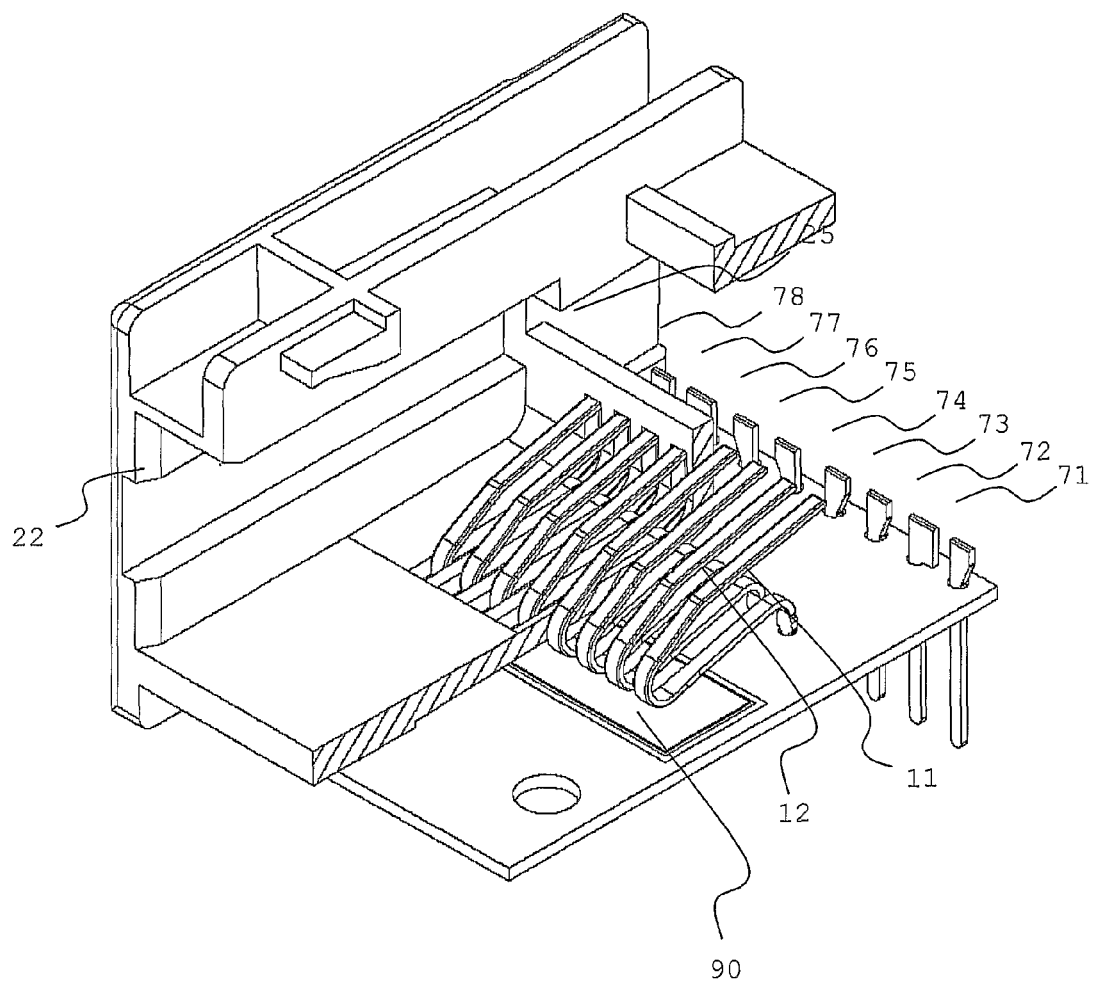
FIG. 2 is a pictorial view showing a side wall of the dielectric housing of the modular jack and an inventive circuit board mounted within the housing.

FIG. 2 is a pictorial view showing a side wall 22 of the housing 20 of the modular jack 10 and the printed circuit board 30 mounted within the housing 20. The circuit board 30 carries the receptacle terminals 11 to 18 and the output terminals 71 to 78. The housing 20 comprises a terminal aligning section 25 which extends from the side wall 22 to the opposite side wall (not shown) of the housing 20. An insulation material 90 is shown on the printed circuit board 30, which isolates the receptacle terminals 11 to 18 from conductive traces on the circuit board 30.

Figure 3:
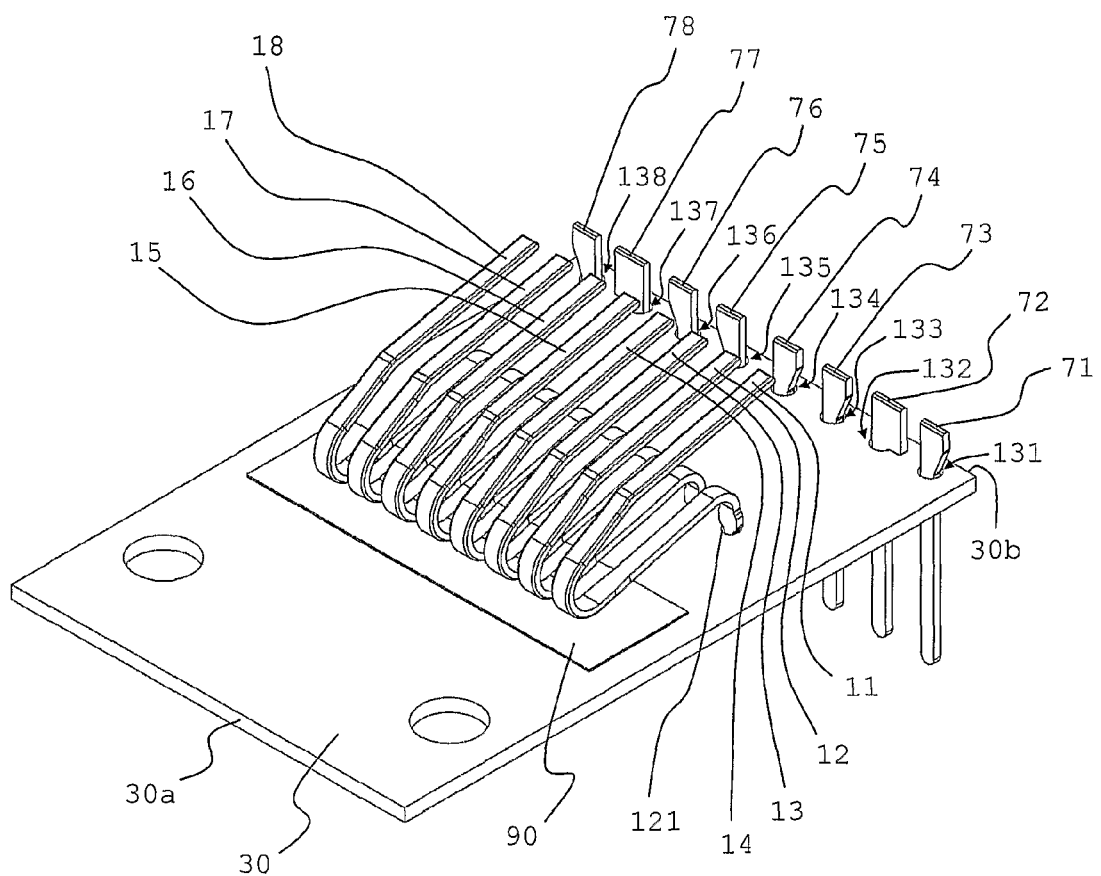
FIG. 3 shows a perspective view of the circuit board with robust receptacle terminals and output terminals without the housing of the modular jack.

FIG. 3 systematically shows the printed circuit board 30 without conductive traces and removed from the dielectric housing 20. As shown in FIG. 3 the eight receptacle terminals 11 to 18 are soldered by respective tail portions to respective conductive traces on the circuit board 30. Each receptacle terminal 11 to 18 comprises a bent portion which is isolated from the printed circuit board 30 by the insulation material 90. Furthermore, the output terminals 71 to 78 are inserted in respective plated through holes 131 to 138 at the rear side of the printed circuit board 30 and extend for example perpendicular to the circuit board 30.

According to a further aspect of the invention receptacle terminals are designed, which are mechanically robust to avoid permanent deflection which may occur when the modular jack 10 is frequently connected and disconnected with a complementary plug.

Figure 4:
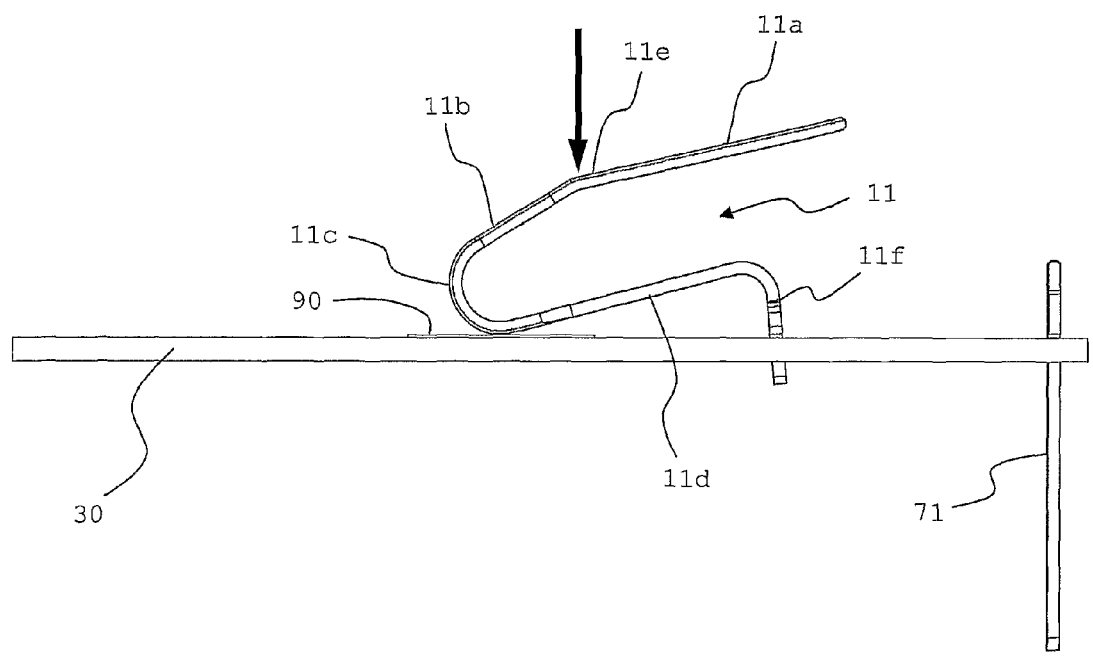
FIG. 4 shows a side view of the circuit board and a receptacle terminal as depicted in FIG. 3.
Figure 5:
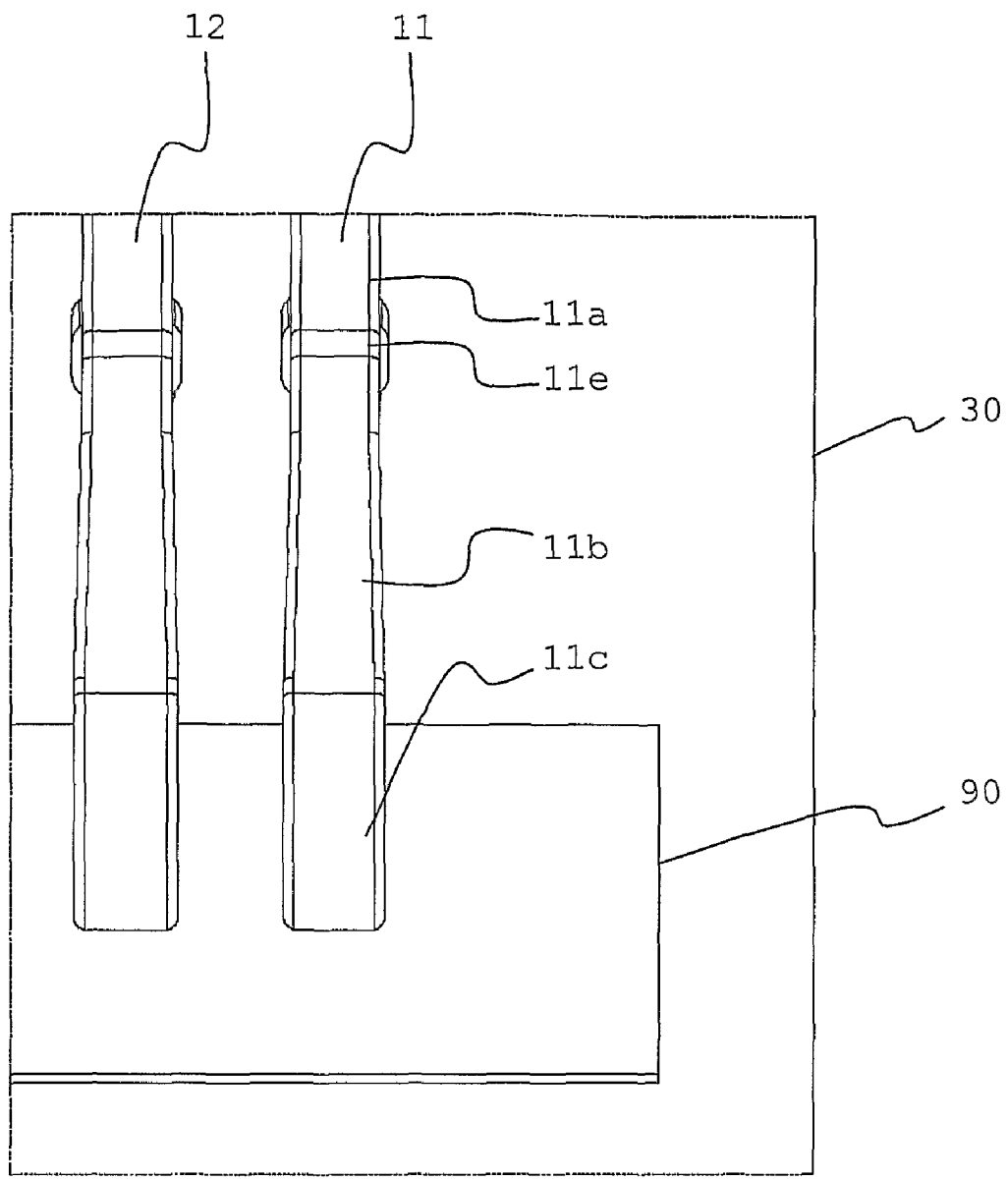
FIG. 5 shows an enlarged, fragmented top view of the printed circuit board as shown in FIG. 3.

This specific design of the robust receptacle terminals and its function can be best understood by referring to FIGS. 4 and 5.

FIG. 4 shows a side view of the printed circuit board 30 together with the receptacle terminal 11 and the output terminal 71. Only for facilitation, the receptacle terminals are now illustrated with respect to terminal 11.

Figure 6:
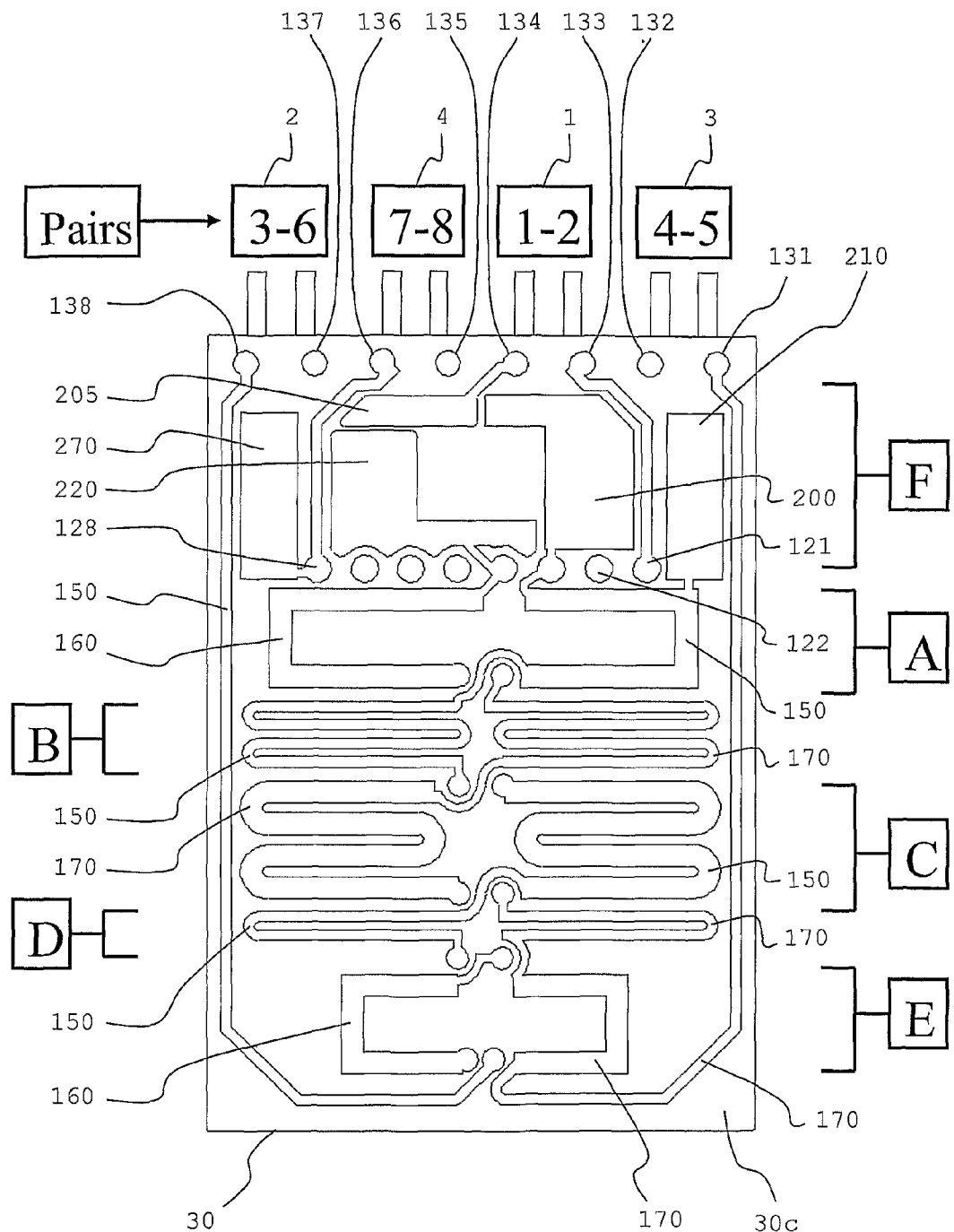
FIG. 6 shows the top surface of the printed circuit board of FIG. 3 without receptacle terminals and with conductive traces which form a part of a multistage compensation circuitry.
Figure 7:
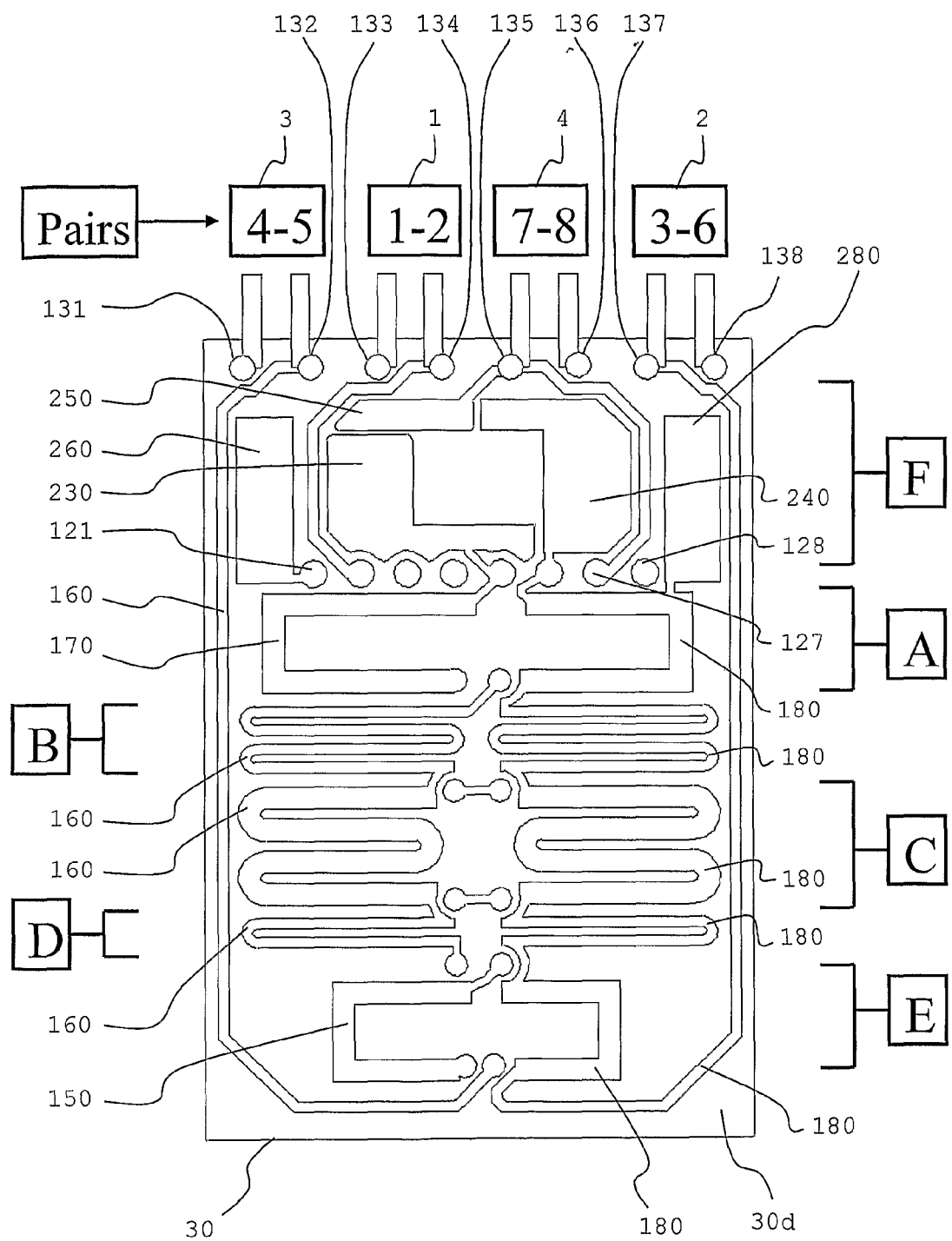
FIG. 7 shows the bottom surface of the printed circuit board of FIG. 3 without the receptacle terminals and with conductive traces which form a part of the multistage compensation circuitry.

Receptacle terminal 11 is, for example, a stamped spring contact which comprises a first leg having two sections 11a and 11b and a second leg 11d. Both sections 11a and 11b are joined to form a bent edge 11e which serves as a contact area for a contact element of a plug. The first leg 11a and 11b and the second legs 11d are located over one another and may extend substantially parallel to each other defining a certain distance between them. The first and second legs 11a, 11b and 11d are joined by a bent portion 11c which defines a predetermined working area having a predetermined working radius. The working radius is chosen to guarantee optimized mechanical performance of the receptacle terminal 11, i.e. a high flexibility by avoiding permanent deformation. The second leg 11d extends from the bent portion 1c to a base end 11f which defines a tail portion for electrically connecting the terminal 11 to the printed circuit board 30. The base end 11f and the second leg 11d includes an angle which preferably lies between 35° to 90°. As shown in FIG. 4, the base end 11f is for example inserted in a through hole of the printed circuit board 30 to electrically contact conductive trace on the printed circuit board 30. The conductive traces are illustrated in FIGS. 6 and 7.

The base end 11f of the receptacle terminal 11 has a predetermine length and is inserted into the through hole of the printed circuit 30 such that the second leg 11d of the receptacle terminal 11 and the top surface of the circuit board 30 define an acute angle. Furthermore, the base end 11f may be inserted into the through hole such that the bent portion 11c of the receptacle terminal 11 does not engage the printed circuit board 30 or the insulation material 90 when no plug is inserted and thus no deflection force works on the receptacle terminal 11. With other words, the bent portion 11c of the receptacle terminal 11 is cantilevered to engage the insulation material 90 on the circuit board 30 at least when the receptacle terminal 11 is contacted by a terminal of a modular plug.

In the shown embodiment, section 11a of the first leg ends in a free end. The first and second legs 11a, 11b and 11d of the receptacle terminal 11 can be biased such that the free end of the first leg 11a, 11b abuts against the terminal aligning section 25 as shown in FIG. 2 when no plug is inserted into the dielectric housing 20. In a preferred embodiment, the ratio between the length of the second leg 11c and the length of the first leg 11a, 11b of the receptacle terminal 11 is larger than 0.8 and in particular about 1.

The specific design of receptacle terminal 11, as shown in FIG. 4, leads to an elastic deflection region to compensate huge dimension tolerances of a plug inserted into the modular jack.

According to RJ 45 specifications, the width of the receptacle terminal 11 in the contact region 11e—and all other receptacle terminals 11 to 17—is fixed. In order to increase the mechanical abilities of the receptacle terminal 11 the bent portion 11c, which forms the working area, is increased with respect to the standardized width of the terminal in contact region 11e. The width of the receptacle terminal 11 tapers from the bent portion 1c to the contact area portion 11e continuously. The slanted shape of the receptacle terminal 11 is shown in detail in FIG. 5. The reliable mechanical abilities of receptacle terminal 11 are obtained inter alia because the receptacle terminal 11 is electrically connected only by the base end 11f to the circuit board 30 which has a predetermined distance from the bent portion 11c. It is to be noted, that the second leg 11d of the receptacle terminal 11 which extends from the base end 11f to the bent portion 11c does not engage neither mechanically nor electrically the printed circuit board 30. Therefore, the flexibility of electrical contact 11e is increased. Furthermore, this specific terminal design allows to substantially dispose conductive traces onto the entire area of the top and bottom layers of the circuit board 30 to form cross talk compensation stages as shown in detail with respect to FIGS. 6 and 7.

The specific design of the receptacle terminals 11 to 18 leads to an increased electrical length of the receptacle terminals which extends from the contact portion 11e on the first leg to the end of the second leg 11d of the receptacle terminal 11.

When using such robust receptacle terminals in a modular jack it is an important challenge to design a compensating circuitry which sufficiently reduces cross talk induced between the receptacle terminals in order to meet the requirements of RJ45 jacks for high frequency transmission. Therefore, it is a further aspect of the invention to design a pattern of conductive traces on a printed circuit board 30 which run on both sides of the printed circuit board forming cross talk compensation stages and time delay stages wherein the printed circuit board is mounted completely within the dielectric housing of the modular jack. It is important to note, that the robust receptacle terminals 11 to 18 are designed such that the conductive traces forming the cross talk compensation stages and the time delay stages run substantially over the entire length and width of the top surface 30c and bottom surface 30d of the printed circuit board 30, as shown in FIGS. 6 and 7.

Referring now to FIG. 6, there is shown the top surface 30c of the printed circuit board 30 with removed receptacle terminals 1 to 8 and output terminals 71 to 78.

A row of eight through holes 121 to 128 are disposed between the rear end 30b and the small central axis (extends from the left to the right side of the printed circuit board, whereas the longitudinal central axis extends from the front end to the rear end) of the printed circuit board 30 and extends parallel to the small central axis. The through holes 121 to 128 are adapted to receive respective portions of the base end of each receptacle terminal 11 to 18. In particular, a portion of the base end of receptacle terminal 11 is inserted into the through hole 121, a portion of the base end of the receptacle terminal 12 inserted into the through hole 122, a portion of the base end of the receptacle terminal 13 is inserted into the through hole 123, a portion of the base end of the receptacle terminal 14 is inserted into the through hole 124, a portion of the base end of the receptacle terminal 15 is inserted into the through hole 125, a portion of the base end of the receptacle terminal 16 is inserted into the through hole 126, a portion of the base end of the receptacle terminal 17 is inserted into the through hole 127, wherein a portion of the base end of the receptacle terminal 18 is inserted into the through hole 128 to be electrically connected to respective electrically conductive traces. A row of through holes 131 to 138 are arranged near the rear side of the printed circuit board 30 for receiving the output terminals 71 to 78, respectively. For example, output terminals 71 and 72 are inserted into through holes 131 and 132, respectively, and connected to a pair of signal wires, which belong to the third pair of signal paths 4-5, as defined above. Output terminals 73 and 74 are inserted into through holes 133 and 134, respectively, and connected to a pair of signal wires, which belong to the first pair of signal paths 1-2, as defined above. Output terminals 75 and 76 are inserted into through holes 135 and 136, respectively, and connected to a pair of signal wires, which belong to the fourth pair of signal paths 7-8, as defined above. Output terminals 77 and 78 are inserted into through holes 137 and 138, respectively, and connected to a pair of signal wires, which belong to the second pair of signal paths 3-6, as defined above and shown in FIG. 3.

The pattern of conductive traces is now described in detail.

As shown in FIG. 6, through hole 121 and thus receptacle terminal 11 is connected via a conductive trace 141, which runs on the top surface 30c of the printed circuit board 30, to the output terminal 73 in through hole 133. Through hole 121 is electrically connected to a conductive pad 260 on the bottom layer of the printed circuit board as shown in FIG. 7 which is disposed in an area which substantially lies between the row of through holes 121 to 128 and the row of through holes 131 to 138.

As shown in FIG. 7, through hole 122 and thus receptacle terminal 12 is connected via a conductive trace 142, which runs on the bottom surface 30d of the printed circuit board 30, to out put terminal 74 in through hole 134. Both, the conductive circuit 141 and 142 are substantially of the same shape and overlie each other, only separated by the printed circuit board. The length of the conductive traces 141, 142 is kept as small as possible to reduce interference therebetween. Furthermore, the conductive trace 142 is electrically connected to a conductive pad 205 which lies on the top surface 30c of the printed circuit board 30 directly in front of the through holes 135 and 136 in an area which is defined by the row of through holes 131 to 138 and the row of through holes 121 to 128.

Through hole 123 and thus receptacle terminal 13 is connected via a conductive trace 150 to out put terminal 78 in through hole 138. Conductive trace 150 runs partially on the top surface 30c of the printed circuit board 30 as shown in FIG. 6 and partially on the bottom surface 30d of the printed circuit board 30 as shown in FIG. 7. As will be explained in detail below, certain portions of conductive trace 150 forms several cross talk compensations stages and time delay stages. Through hole 123 and thus the base end of receptacle terminal 13 is further connected to a conductive pad 200 disposed on the top surface 30c of the printed circuit board 30 between the row of through holes 121 to 128 holding the receptacle terminals 11 to 18 and the row of through holes 131 to 138 associated with the output terminals 71 to 78. As will be explained in more detail below, the conductive pad 200 is part of a capacitor. Furthermore, conductive trace 150 is electrically connected to a conductive pad 210 on the top layer of the circuit board 30. The conductive pad 210 is disposed parallel to the conductive pad 200 and in front of through holes 131 and 132 and overlies conductive pad 260 on the bottom layer, thereby forming a further capacitor.

Through hole 124 and thus receptacle terminal 14 is connected via a conductive trace 160 to output terminal 72 in through hole 132. The conductive trace 160 runs partially on the top layer of the printed circuit board 30 as shown in FIG. 6 and partially on the bottom layer of the printed circuit board as shown in FIG. 7. Furthermore, a conductive pad 220 is connected to through hole 124. The conductive pad 220 is disposed on the top surface 30c of the circuit board 30 and between the through holes 124 to 127 and the trough holes 134 to 137. The conductive pad 220 is L-shaped having a leg which lies in front of the through holes 124 to 127.

Next, through hole 125 and thus receptacle terminal 15 is connected via a conductive trace 170 to output terminal 71 in through hole 131. As shown in FIGS. 6 and 7, conductive trace 170 partially runs onto the top and partially onto the bottom surface 30d of the printed circuit board 30. Similar to conductive traces 150 and 160 conductive trace 170 belongs to several cross talk compensation stages and time delay stages as will be described later. Through hole 125 is electrically connected to a conductive pad 230 which is disposed on the bottom layer of the printed circuit board 30 as shown in FIG. 7. The conductive pad 230 lies between through holes 122 to 125 and trough holes 133. The shape of conductive pad 230 is similar to the shape of the conductive pad 220. Therefore, conductive pad 220 overlies partially the conductive pad 230 in the near of through holes 124 and 125.

Through hole 126 and thus receptacle terminal 16 is connected via a conductive trace 180 to output terminal 77 in through hole 137. Conductive trace 180 runs over its entire length on the bottom layer of the circuit board 30. Through hole 126 is also connected to a conductive pad 240 which is disposed on the bottom layer of the printed circuit board 30 and lies between the row of through holes 131 to 138 and the row of through holes 121 to 128. Furthermore, the conductive pad 240 has the same shape as the conductive pad 200 on the top layer of the printed circuit board 30. Conductive pad 240 partially overlies conductive pad 220 which are divided by the dielectric material of the printed circuit board and thus forming a further capacitor. Furthermore, conductive trace 180 is electrically connected to a conductive pad 280 which lies substantially in an area which is defined by the row of through holes 131 to 138 and the row of through holes 121 to 128. In addition, a section of conductive pad 240 overlies the conductive pad 205 on the top layer, thereby forming a further capacitor.

Through hole 127 and thus receptacle terminal 17 is connected via a conductive trace 190 to output terminal 75 in through hole 135. The conductive trace 190 runs over its entire length on the bottom layer of the printed circuit board 30. The conductive trace 190 only runs between the area which is defined by the row of through holes 131 to 138 and the row of through holes 121 to 128. The conductive trace 190 terminates at a conductive pad 250 which is disposed on the bottom layer of the circuit board directly in front of the through holes 133 and 134. Therefore, conductive pad 250 overlies a section of the conductive pad 200 which are isolated by the dielectric material of the printed circuit board, thereby forming a further capacitor.

Through hole 128 and thus receptacle terminal 18 is connected via a conductive trace 195 to output terminal 76 in through hole 136. The conductive trace 195 runs on the top layer of the circuit board 30 and substantially between the area defined by the row of through holes 131 to 138 and the row of through holes 121 to 128. Through hole 128 is further connected to a conductive pad 270 which is disposed on the top layer on the printed circuit board and extends substantially between the area defined by the row of through holes 131 to 138 and the row of through holes 121 to 128. Conductive pad 270 has the same shape as conductive pad 280 on the bottom layer of the printed circuit board. Both conductive pad 270 and conductive pad 280 form an additional capacitor.

The conductive or capacitive pads 200, 205, 210, 220 and 270 on the top layer as well as the conductive or capacitive pads 230, 240, 250, 260 and 280 form respective capacitors to primary couple capacitively the second pair 3-6 of signal paths on the third pair 4-5 of signal paths. Furthermore, these conductive pads capacitively couple the other pairs of signal paths to compensate NEXT and FEXT.

These conductive pads as shown in FIGS. 6 and 7 define a compensation stage designated F which is generally disposed between the row of through holes 121 to 128 and the row of through holes 131 to 138 and which extends substantially over the entire width of the printed circuit board.

The conductive traces 150, 160, 170 and 180 not only connect the receptacle terminals 13, 14, 15 and 16 to the output terminals 78, 72, 71 and 77, respectively, but also define three cross talk compensation stages A, C, E and two time delay stages B and D as shown in FIGS. 6 and 7.

As mentioned above, it is an aspect of the invention, to compensate cross talk induced between the receptacle terminals 3, 6 and 4, 5 which belong to the second and the third pair of signal paths, respectively.

As illustrated in the FIGS. 6 and 7 the stages A to E are disposed between the row through holes 121 to 128 and the front end of the printed circuit board 30. The cross talk compensation stages A, C and E and the time delay stages B and D are arrange alternately to each other, i.e. cross talk compensation stage A is directly disposed in front of the through holes 121 to 128, followed by the first time delay stage B, followed by the second cross talk compensation stage C, followed by the second time delay stage D which is followed by the third cross talk compensation stage E in the near of the front end of the printed circuit board 30.

In particular, a first section of the conductive traces 160 and 150 which belong to the second pair 3-6 of signal paths are disposed on the top layer of the printed circuit board 30, wherein a first section of the conductive traces 170 and 180 which belong to the third pair 4-5 of signal paths are disposed on the bottom layer of the printed circuit board. The respective first portions form the first cross talk compensation stage A. The first section of the conductive trace 160 overlies substantially the first of conductive trace 180, wherein the first section of conductive trace 150 overlies substantially the first section of conductive trace 170. Therefore, signal energy of conductive trace 150 is cross coupled on conductive trace 180, wherein signal energy of conductive trace 160 is cross coupled on conductive trace 170.

In a preferred embodiment, the first sections of conductive trace 150 and 160 define rectangular shape on the top layer, wherein the first sections of conductive trace 170 and 180 define a rectangular shape on the bottom layer, with a longitudinal axis perpendicular to the longitudinal axis of the printed circuit board 30. With such a design the first cross talk compensation stage A serves to capacitively and inductively couple energy from a signal line of the second pair to a signal line of the third pair of signal paths to affect both effects both near end (NEXT) and far end (FEXT) cross talk.

In addition, each of the conductive traces 150 and 170 comprises second sections on the top layer of the printed circuit board 30, whereas each of the conductive traces 160 and 180 comprise second sections on the bottom layer on the printed circuit board 30 which define the first time delay stage B. The second section of the circuit trace 150 overlies the second section of the conductive trace 180 which are separated by the dielectric material of the printed circuit board 30. In a similar manner, the second section of conductive trace 170 overlies the second section of conductive trace 160, which are separated by the dielectric material of the printed circuit board. The second sections of the conductive traces 150, 160, 170 and 180 have a snake like shape with a longitudinal axis perpendicular to the longitudinal axis of the printed circuit board. The snake like shape of second sections of the conductive traces 150 to 180 leads to a minimum coupling between the second and third pair of signal paths. With such a design, a time delay is introduced in the conductive traces used to control NEXT.

Furthermore, each of the conductive traces 150 and 170, which belong to the second pair 3-6 and the third pair 4-5 of signal paths, respectively, comprises third sections disposed on the top layer of the printed circuit board 30 forming part of the second cross talk compensation stage C. Each of the conductive traces 160 and 180, which belong to the second pair 3-6 and the third pair 4-5 of signal paths, respectively, also includes third sections which are disposed on the bottom layer of the printed circuit board 30 to form the other part of the second cross talk compensation stage C. Similar to the time delay stage B, the third sections of the conductive traces 150 to 180 have a snake like shape with a longitudinal axis perpendicular to the longitudinal axis of the printed circuit board. The third section of the conductive trace 150 overlies substantially the third section of the conductive trace 160, wherein the third section of conductive trace 170 overlies substantially the third section of conductive trace 180. Therefore, signal energy of conductive trace 150 is cross coupled on conductive trace 160 wherein signal energy of conductive trace 170 is cross coupled on conductive trace 180.

In addition, each of the conductive traces 150 and 170 comprises fourth sections disposed on the top layer of the printed circuit board 30 which form part of the second time delay stage D. Also, each of the conductive traces 160 and 180 comprise fourth sections on the bottom layer of the printed circuit board 30 which form the other part of the second time delay stage D. The fourth sections of the conductive traces 150 to 180 have a snake like shape used to introduce a time delay in the signal transmitted to control NEXT. In the preferred embodiment, the fourth section of the conductive trace 150 overlies substantially the fourth section of the conductive trace 160, wherein the fourth section of conductive trace 170 overlies substantially the fourth section of conductive trace 180.

Moreover, each of the conductive traces 160 and 170 comprises a fifth section on the top layer to form a portion of the third cross talk compensation stage E, wherein each of the conductive traces 150 and 180 comprises fifth sections with are also part of the third cross talk compensation stage E formed on the bottom layer of the printed circuit board 30. Similar to the first section of the conductive traces 150 to 180 which form the first cross talk compensation stage A the fifth sections define a rectangular shape having a longitudinal axis perpendicular to the longitudinal axis of the printed circuit board 30. The fifth section of the conductive trace 160 substantially overlies the fifth section of the conductive trace 180, whereas fifth section of the conductive trace 170 substantially overlies the fifth section of the conductive trace 150. The points at which the conductive traces change from the top layer to the bottom layer of the printed circuit board 30 are also depicted in FIGS. 6 and 7.

It is to be noted, that the sections of the conductive traces 150 to 180 which form the cross talk compensation stages A, C and E as well as the time delay stages B and D are substantially symmetrically disposed with respect to the long central axis (which extends from the rear side to the front side of the printed circuit board) of the printed circuit board 30. Furthermore, these sections are distributed substantially over the entire region of the top and bottom layers of the printed circuit board 30 which is defined by the row of the through holes 121 to 128 and the front end as well as the left and right side of the printed circuit board 30.

Furthermore, it should be noted, that the width of the conductive traces 150 to 180 forming the cross talk compensation stage A, C and E are wider than the width of the remaining conductive traces. This specific dimension serves to minimize the return loss of the modular jack. The specific design has become necessary since the signal paths of pairs 2 and 3 are much longer than the signal paths of the pairs 1 and 4 as illustrated in FIGS. 6 and 7.

Furthermore, it is important to note, that the conductive traces 150 and 170 on the top layer run near the front end and along the left and right side of the printed circuit board 30 to the output terminals 71 and 78 in the through holes 131 and 138, respectively, to maintain a maximum distance to each other. Similar, the conductive traces 160 and 180 on the bottom layer run near the front end and along the left and right side of the printed circuit board 30 to the output terminal 72 and 72 in the through holes 132 and 137, respectively, to keep a maximum distance therebetween. Therefore, the row of the through holes 131 to 138, the row of the through holes 121 to 128 and a first length of the conductive traces 150 and 170 on the top layer form a first area on the top layer which the capacitive pads 210, 200, 220, 205 and 270 are disposed on. The row of the through holes 131 to 138, the row of the through holes 121 to 128 and a first length of the conductive traces 160 and 180 on the bottom layer form a second area on the bottom layer which the capacitive pads 230, 240, 250, 260 and 280 are disposed on. Furthermore, the row of the through holes 121 to 128, a second length of the conductive traces 150 and 170 on the top layer and a third length of the conductive traces 150, 170 running adjacent to the front side of the circuit board 30 define a third area on the top layer which includes portions of the cross talk compensation stages A, C and E and portions of the time delay stages B and D. The row of the through holes 121 to 128, a second length of the conductive traces 160 and 180 on the bottom layer and a third length of the conductive traces 160, 180 running adjacent to the front side of the circuit board 30 define a fourth area on the bottom layer which includes the other portions of the cross talk compensation stages A, C and E and the other portions of the time delay stages B and D.

It is also important to note, that the specific pattern of the conductive traces 141, 142, 150, 160, 170, 180, 190 and 195 avoid crossing over regions on both the top surface 30c and the bottom surface 30d of the printed circuit board 30 as shown in FIGS. 6 and 7.

The invention claimed is:

1. A cross talk compensation assembly for mounting within a modular jack, comprising:

a circuit board, the circuit board having a rear end, a front end and a plurality of conductive traces thereon, which are at least partially adapted to compensate cross talk; and a plurality of receptacle terminals supported on the circuit board, each receptacle terminal including a base end fixed to the circuit board, first and second legs located over one another with one end of each leg joined to the other leg by a bent portion, the first leg ending in a free end and the second leg extending from the base end toward the bent portion such that it forms an acute angle with the circuit board, each receptacle terminal having at least one electrical contact area designed to electrically contact a respective one of the conductive traces on the circuit board, the bent portion of each receptacle terminal being cantilevered to engage the circuit board at least when one or more of the receptacle terminals is contacted by a terminal of a modular plug, wherein the bent portion of each receptacle terminals is electrically insulated from the circuit board by a dielectric material, wherein the circuit board has a top surface and a bottom surface, at least four conductive traces running on the top surface and/or on the bottom surface of the circuit board, each conductive trace having a first contact region and a second contact region, the first contact regions being arranged in a first row parallel and adjacent to the rear end, each first contact region being adapted to electrically contact a separate output terminal, the second contact regions being arranged in a second row spaced apart from and parallel to the first row of the first contact regions, each of the second contact regions being adapted to electrically contact a separate one of the receptacle terminals, the first row of first contact regions, the second row of second regions and a first length of each of the conductive traces defining a first area on the top surface and a second area on the bottom surface, wherein a plurality of capacitive pads are disposed on the first area and the second area to form respective capacitors, the second row of second contact regions, a second length of each conductive trace and a third length of each conductive trace adjacent to the front end defining a third area on the top surface and a fourth area on the bottom surface, wherein the conductive traces are designed to form a plurality of cross talk compensation stages and time delay stages on the third area of the top surface and on the second area of the bottom surface.

2. The assembly according to claim 1, wherein the receptacle terminals are contact springs.

3. The assembly according to claim 1, wherein the first leg of each receptacle terminal has a contact portion for engaging a terminal of a modular plug, the width of the bent portion of each terminal is larger than the width of the contact portion of the first leg of the respective receptacle terminal and wherein the width of the bent portion tapers toward the free end of the first leg of each receptacle terminal.

4. The assembly according to claim 1, wherein at least one conductive trace of the first pair of signal paths and at least one conductive trace of the second pair of signal paths are disposed on the top surface and on the bottom surface of the circuit board, each of the conductive traces of the first and second pairs of signal paths having first sections which are designed to form a first cross talk compensation stage on a first region of the circuit board to couple inductively and/or capacitively a first signal path of the first pair to a second signal path of the second pair of signal paths and a second signal path of the first pair to a first signal path of the second pair.

5. The assembly according to claim 4, wherein each of the conductive traces of the first and second pairs of signal paths have second sections which are designed to form a second cross talk compensation stage on a second region of the circuit board to couple inductively and/or capacitively the first signal path of the first pair to the first signal path of the second pair of signal paths and the second signal path of the first pair to a second signal path of the second pair.

6. The assembly according to claim 5, wherein each of the conductive traces of the first and second pairs of signal paths comprises third sections which are designed to form a third cross talk compensation stage on a third region of the circuit board to couple inductively and/or capacitively a first signal path of the first pair to a second signal path of the second pair of signal paths and a second signal path of the first pair to a first signal path of the second pair.

7. The assembly according to claim 4, wherein each of the conductive traces of the first and second pairs of signal paths comprises fourth sections which are designed to form a first time delay stage on a fourth region of the circuit board to introduce a time delay on the signal paths of the first and second pairs and wherein each of the conductive traces of the first and second pairs of signal paths comprises fifth sections which are designed to form a second time delay stage on a fifth region of the circuit board to introduce a further time delay on the signal paths of the first and second pairs.

8. The assembly according to claim 6, wherein a fourth cross talk compensation stage is formed by the plurality of capacitive pads and wherein the first through third cross talk compensation stages and both time delay stages are alternately disposed between the front end of the circuit board and the base ends of the receptacle terminals.

9. A printed circuit board for use with a cross talk compensation assembly, comprising:
a rear end, a front end, a top surface and a bottom surface, at least four conductive traces running on the top surface and/or on the bottom surface of the circuit board, each conductive trace having a first contact region and a second contact region, the first contact regions being arranged in a first row parallel and adjacent to the rear end, each first contact region being adapted to electrically contact a separate output terminal, the second contact regions being arranged in a second row spaced apart from and parallel to the first row of the first contact regions, each of the second contact regions being adapted to electrically contact a separate receptacle terminal, first row of first contact regions, the second row of second regions and a first length of each of the conductive traces defining a first area on the top surface and a second area on the bottom surface, wherein a plurality of capacitive pads are disposed on the first area and the second area to form respective capacitors, the second row of second contact regions, a second length of each conductive trace and a third length of each conductive trace adjacent to the front end defining a third area on the top surface and a fourth area on the bottom surface, wherein the conductive traces being designed to form a plurality of cross talk compensation stages and time delay stages on the third area of the top surface and on the second area of the bottom surface.

10. The printed circuit board according to claim 9, wherein the capacitive pads and the sections of the conductive traces forming the plurality of cross talk compensation stages and time delay stages are arranged symmetrically along the long central axis of the printed circuit board.

11. The printed circuit board according to claim 9, wherein a pair of adjacent second contact regions are connected via respective conductive traces to pair of adjacent first contact regions, thereby forming a first pair of signal paths, a further pair of second contact regions flanking the pair of adjacent second contact regions are connected via separate conductive traces to the other pair of adjacent first contact regions, thereby forming a second pair of signal paths.

12. The printed circuit board according to claim 9, wherein at least one conductive trace of the first pair of signal paths and at least one conductive trace of the second pair of signal paths are disposed on the top surface and on the bottom surface of the circuit board, each conductive trace of the first and second pairs of signal paths having first sections which are designed to form a first cross talk compensation stage on a first region of the circuit board to couple inductively and/or capacitively a first signal path of the first pair to a second signal path of the second pair of signal paths and a second signal path of the first pair to a first signal path of the second pair.

13. The printed circuit board according to claim 12, wherein each of the conductive traces of the first and second pairs of signal paths comprises second sections which are designed to form a second cross talk compensation stage on a second region of the circuit board to couple inductively and/or capacitively the first signal path of the first pair to the first signal path of the second pair of signal paths and the second signal path of the first pair to a second signal path of the second pair.

14. The printed circuit board according to claim 13, wherein each of the conductive traces of the first and second pairs of signal paths comprises third sections which are designed to form a third cross talk compensation stage on a third region of the circuit board to couple inductively and/or capacitively a first signal path of the first pair to a second signal path of the second pair of signal paths and a second signal path of the first pair to a first signal path of the second pair.

15. The printed circuit board according to claim 9, wherein each of the conductive traces of the first and second pairs of signal paths comprises fourth sections which are designed to form a first time delay stage on a fourth region of the circuit board to introduce a time delay on the signal paths of the first and second pairs.

16. The printed circuit board according to claim 15, wherein each of the conductive traces of the first and second pairs of signal paths have fifth sections which are designed to form a second time delay stage on a fifth region of the circuit board to introduce a further time delay on the signal paths of the first and second pairs.

17. The printed circuit board according to claim 12, wherein at least the second, third and fourth sections of each conductive trace of the first and second pair of signal paths are snake like formed with a longitudinal axis perpendicular to the longitudinal axis of the circuit board.

18. The printed circuit board according to claim 12, wherein the width of at least portions of the conductive traces forming the first, second and/or third cross talk compensation stage is wider than the width of the respective conductive traces forming the first and second time delay stage.

19. The printed circuit board according to claim 9, wherein a fourth cross talk compensation stage is formed by the plurality of capacitive pads and wherein the first through third cross talk compensation stages and both time delay stages are alternately disposed between the front end of the circuit board and the base ends of the receptacle terminals.

20. The printed circuit board according to claim 9, wherein fifth and sixth conductive traces run on the top surface and seventh and eighth conductive traces run on the bottom surface of the circuit board, each further conductive trace having a first contact region and a second contact region, the first contact regions being arranged in the first row and the second contact regions being arranged in the second row, wherein the fifth and sixth conductive traces are disposed on the first area of the top surface and extend between respective capacitive pads, and wherein the seventh and eighth conductive traces are disposed on the second area of the bottom surface and extend between respective capacitive pads.

* * * * *